United States Patent [19]

Millar

[11] Patent Number: 4,729,112

[45] Date of Patent: Mar. 1, 1988

[54] DIGITAL SUB-BAND FILTERS

[75] Inventor: Paul C. Millar, Felixtowe, England

[73] Assignee: British Telecommunications, London, England

[21] Appl. No.: 594,888

[22] Filed: Mar. 21, 1984

[30] Foreign Application Priority Data

Mar. 21, 1983 [GB] United Kingdom ............... 8307702

[51] Int. Cl.$^4$ .............................................. G06F 7/38
[52] U.S. Cl. .................................................. 364/724
[58] Field of Search ..................... 364/724; 375/103; 342/159

[56] References Cited

U.S. PATENT DOCUMENTS

| | | | |
|---|---|---|---|
| 4,135,057 | 1/1979 | Bayless, Sr. et al. | 178/67 |
| 4,232,373 | 11/1980 | Jackson et al. | 364/724 |
| 4,317,092 | 2/1982 | Potter . | |
| 4,360,793 | 11/1982 | Rhodes et al. | 333/212 |
| 4,393,272 | 7/1983 | Itakura et al. | 364/724 |
| 4,418,324 | 11/1983 | Higgins | 333/204 |
| 4,422,156 | 12/1983 | Sand | 364/724 |
| 4,472,785 | 9/1984 | Kasuga | 364/724 |
| 4,491,799 | 1/1985 | Giardenelli | 330/2 |
| 4,507,794 | 3/1985 | Jones et al. | 375/55 |
| 4,513,263 | 4/1985 | Minnis | 333/204 |
| 4,520,499 | 5/1985 | Montlick et al. | 381/36 |
| 4,547,819 | 10/1985 | Meitner et al. | 360/65 |
| 4,554,858 | 11/1985 | Wachi et al. | 84/1.19 |
| 4,586,193 | 4/1986 | Seiler et al. | 381/51 |

OTHER PUBLICATIONS

IEE ICASSP 1977, "Application of Quadrature Mirror Filtering to Split Band Voice Coding Schemes"; D. Esteban and C. Galand; IBM.
The Bell System Technical Journal, May, Jun. 1977, "On the Design of Sub-Band Coders for Low-Bit-Rate Speech Communications, by R. E. Crochiere, pp. 748-771.
The Bell System Technical Journal, Oct. 1976, "Digital Coding of Speech in Sub-Bands, by R. E. Crochiere et al, pp. 1069-1085.
ICASSP 79-1979 IEE International Conference on Acoustics, Speech & Signal Processing, International Inn, Washington, D.C. (US), Apr. 2-4, 1979, R. A. Gabel: "On the Design of Complementary Filters", pp. 805-808.
Signal Processing Theories and Applications, Proceedings of EUSIPCO-80, First European Signal Processing Conference, Lausanne (CH), Tor A. Ramstad et al: "Sub-Band Coder Design Using Recursive Quadrature Mirror Filters", pp. 747-752.
"Sub-Band Coder Design Incorporating Recursive Quadrature Filters and Optimum ADPCM Coders", by Thomas P. Barnwell, III, IEEE.
Transactions on Acoustics, Speech and Signal Processing, vol. ASSP30, No. 5, Oct. 1982, pp. 751-765.

Primary Examiner—Gary V. Harkcom
Assistant Examiner—Dale M. Shaw
Attorney, Agent, or Firm—Nixon & Vanderhye

[57] ABSTRACT

A digital signal is separated into a lower frequency subband and a high frequency subband using quadrature mirror filters. The singularities of each filter, represented in the z-plane, comprise a zero on the real axis and unit radius, with other groups each contributing a symmetrical delay response. At least one such group has a pole at $r$, $\theta$ and a zero at $1/r$, $\pi - \theta$.

12 Claims, 15 Drawing Figures

DIGITAL SUB-BAND FILTERS

This invention relates to digital filters for use in sub-band coding arrangements.

Sub-band coding has been shown to be an effective method of reducing the bit-rate required for the transmission of signals—see, for example Crochiere, Webber and Flanagan "Digital Coding of Speech in Sub-bands". Bell System Technical Journal, vol. 55 pp. 1069–1085 (October 1976) and Crochiere, "On the Design of Sub-band Coders for Low Bit-Rate Speech Communication", ibid Vol. 56, pp. 747–779 (May-June 1977).

The technique involves splitting the broadband signal into two or more frequecy bands and encoding each band separately. Each band can then be down-sampled, and coding efficiency improved by using different coding strategies, which can be optimised to the statics of the signal. This is especially advantageous for speech transmission since it can exploit certain perceptual effects connected with hearing; for example that the human ear is relatively tolerant to (quantisation) noise in parts of the spectrum occupied by high-level signal components, and that the higher frequency components require less accuracy because the ear is less sensitive to their absolute content. After transmission, the individual subbands are up-sampled and passed through interpolation filters prior to recombination.

The sub-bands are usually contiguous to avoid deadband regions in the overall frequency response. As filters with an infinitely sharp cutoff cannot be realised, a degree of subband overlap results, which results in the generation of alias components in the down-sampling process. It has been shown that by defining suitable relationships between the coding and interpolation filters, alias cancellation can be achieved upon recombination (Esteban and Galand, "Application of Quadrature Mirror Filters to Split Band Voice Coding Schemes", IEEE Int Conf on ASSP, pp. 191-195, Hartford CT, 1977). One such proposal involves the use of quadrature mirror filters; viz a pair of filters whose responses are mirror images about a transition frequency (usually one-quarter of the sampling frequency) and whose phase responses differ by 90° at all frequencies.

The response of a digital filter is commonly expressed as its z transform, defined by $$H(z) = \sum_{n=-\infty}^{\infty} h(nT)z^{-n}$$

where h(nT) is the impulse response of the filter (output at time nT due to a unit impulse at time 0), T being the sampling period.

z is a complex variable and plays a similar role to that of the variable s of the Laplace transform commonly used for continuous systems. As with the s-plane, the singularities (poles and zeroes) can be plotted on the z-plane. If represented in polar co-ordinates ($z=re^{j\theta}$) the angular co-ordinate represents the relative frequency; $\theta = WT = 2\pi f/f_s$ where fs is the sampling frequency ($f_s = 1/T$). The closer r is to unity the more localised is the effect of the singularity around frequency $\theta$. Note that it is neither possible nor necessary to represent frequencies in excess of half the sampling frequency since such frequencies give rise to aliases below that frequency, ie the frequency spectrum of the sampled signal repeats with period $2\pi$.

The present invention is concerned with filters and quadrature mirror filters pairs for use in sub-band coding, and the filters will be defined by reference to the positions of their singularities in the z-plane.

According to one aspect of the present invention there is provided a digital filter having a stopband, a transition band and a passband, the transfer function of the filter including poles for enhancing signals with frequencies in the passband, zeros for attenuating signals with frequencies in the stopband, and poles for enhancing signals in the transition band, in which the singularities include a pole for attenuating signals with frequencies in the stopband which, in the z-plane representation, lies on the real axis at unit radius, and the remainder of the singularities occur in groups each possessing a symmetrical delay response about a relative frequency of $\pi/2$ radians, characterised in that at least one of such groups consists of a pole having in the z-plane polar coordinates r, $\theta$ and a zero having coordinates $1/r$, $(\pi - \theta)$.

In another aspect the invention provides a digital filter arrangement for sub-band coding apparatus comprising a low-pass filter having a stopband contained in an upper subband and a passband contained in a lower subband and a high-pass filter having a stopband coincident with the passband of the low-pass filter and a pass band coincident with the stop band of the low-pass filter, wherein both filters include poles for enhancing signals with frequencies in a transition band between the stopband and passband and each filter includes zeros for attenuating signals with frequencies in its own stopband and poles for enhancing signals with frequencies in its own passband, wherein one filter has singularities lying in the z-plane representation at polar coordinates r, $\theta$ and the other has like singularities lying at polar coordinates r, $(\pi - \theta)$; wherein the low pass and high-pass filters each have a zero at coordinates 1, $\pi$ and 1, 0 respectively, and the remainder of the singularities occur in groups each possessing a symmetrical delay response about a relative frequency of $\pi/2$ radians, characterised in that at least one of such groups consists of a pole having, in the z-plane, polar coordinates r, $\theta$ and a zero having coordinates $1/r$, $(\pi - \theta)$.

It will be seen that the provision of the zeros on the real axis provides the required quadrature relationship between the two filters, and that the remaining groups are subject to the constraint of symmetrical delay response so that this relationship is maintained. The proposed pole-zero groups meet this condition whilst permitting the introduction of poles causing signal enhancement only in the passband region and on the passband side of the transition region without the intrusion of poles causing enhancement in the stopband region.

For real filter coefficients, the pole-zero groups occur in complex conjugate pairs and imply a transfer function $$H(z) = \frac{B - Az^{-1} + z^{-2}}{1 + Az^{-1} + Bz^{-2}} H'(z)$$

where H'(z) is the response attributable to the other singularities.

Preferably all the singularities in that section of the z-plane bounded by angles corresponding to the frequency limits of the transition band are poles.

The filter arrangement is conveniently implemented as a common sub-unit for enhancing frequencies in the transition zone and a sub-unit having its output connected to upper and lower sub-units each adapted to attenuate frequencies outside its own subband and, most suitably, to enhance frequencies within its own subband.

The performance and structure of digital filters according to the invention will now be described in terms of the singularities of the filter and an optimal network for the realisation of a preferred embodiment. The filter means includes two elements and the description will include:

(a) a definition of the inter-element symmetry, i.e. the necessary relationship between the singularities of one element and those of the other;

(b) a description of preferred intra-element symmetries, i.e. desirable relationships between the singularities of each element;

(c) preferred locations of the singularities of preferred embodiments; and (d) a network being an optimal realisation of a preferred filter.

The splitting frequency will be taken as that most commonly required, namely 90°.

This description will refer to the accompanying drawings in which.

The two band splitting filters are required to have mirror image responses. This means that disposition in the z-plane of the singularities of one of the filters is the reflection in the imaginary axis of the singularity distribution of the elements of the other filter. For the desired quadrature relationship, the low-pass and the high-pass filter have zeroes on the unit circle on respectively the negative and positive real axes. This simple relationship means that it is necessary only to describe the one filter and the low pass element filter be selected for description.

Figure 1:
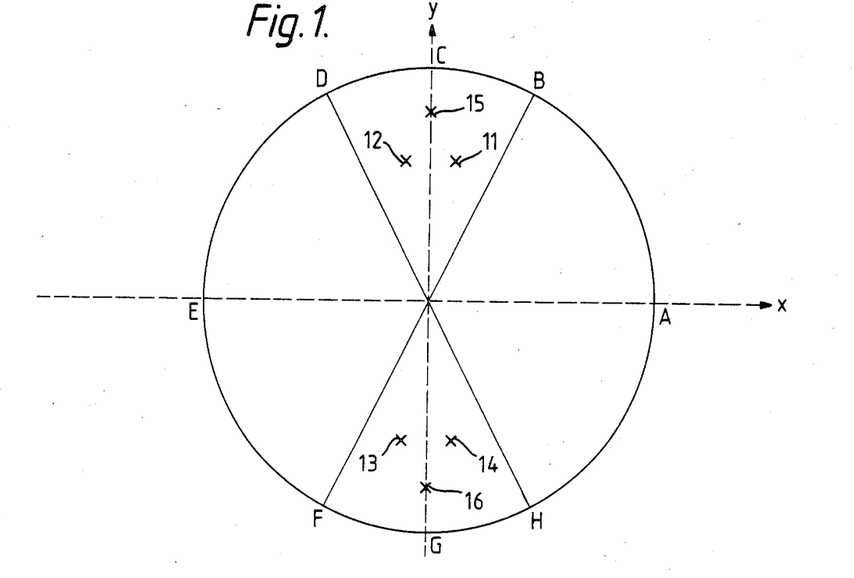
FIGS. 1 to 3 show intra element symmetry of the singularities

FIG. 1 show a z-plane diagram. Ideally, the unit circle of this plane is notionally divided into two sectors as follows:

GAC which relates to the desired passband region in which the signal should, ideally, not be attenuated by the filter;

CEG which relates to the desired stopband region in which signal should, ideally, be attenuated to zero.

This perfection cannot be achieved since it requires an infinitely sharp cut-off edge. Thus, the filter also has transition band regions in which there is a continuous transition from "pass" to "stop". BCD and HGF relate to the transition regions and will be called the z-plane transition zones. Similarly HAB relates to the reduced passband and will be called the z-plane passband region, and DEF relating to the reduced stopband and will be called the z-plane stopband zone.

The desired response is formed by groups of singularities which preserve the quadrature relationships, for ease of reference they will be referred to as type 1, type 2 etc.

TYPE 1 symmetry as shown in FIG. 1 is particularly appropriate for singularities in the transition band region. For filters of a given order, with a given stopband rejection and passband ripple, these singularities should be poles in order to keep the transition region optimally narrow. For best results it is also necessary that the pattern of the position of these poles be symmetrical on reflection in both real and imaginary axes. Thus the poles occur in sets of four, and poles 11, 12, 13 and 14 of FIG. 1 illustrate such a set. Their rectangular coodinates are $(x, y)$ $(x, -y)$ $(-x, y)$ and $(-x, -y)$.

There is a degenerate case, illustrated by poles 15 and 16 in which the poles coalesce to become a single pair. In this case the coordinates are $(O, y)$ and $(O, -y)$. The degenerate case will be referred to as Type 1D symmetry and it is preferred to incorporate one pair of this type in each element. Poles with Type 1 (and 1D) symmetry are self-symmetrical between the elements, i.e both elements contain identical pole structures in the transition zone. Type 1 (and 1D) singularities result in enhancement of the amplitude of signal components with frequencies in the transition band region.

Figure 2:
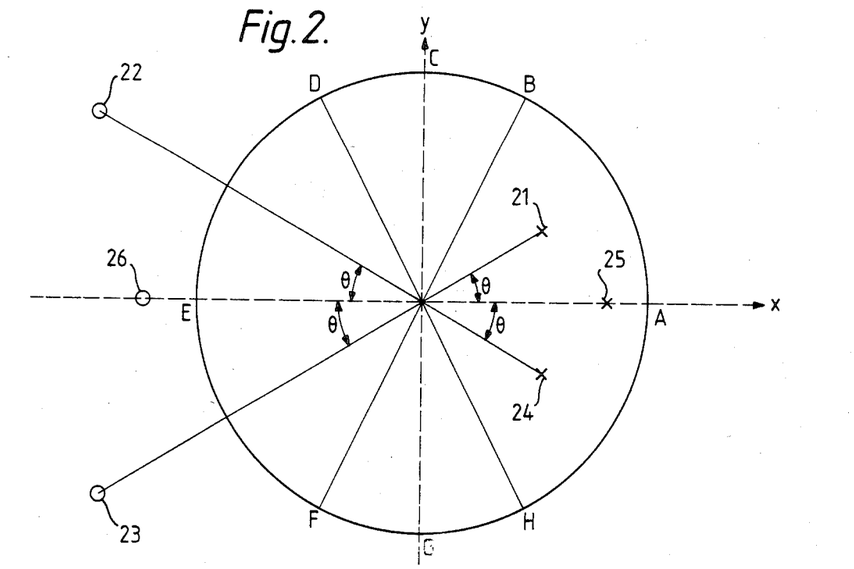

TYPE 2 symmetry is appropriate for poles in the passband zone which are matched by zeros situated in the stopband zone. The basic symmetry is most easily specified using polar coordinates. A pole at $(r, \theta)$ is balanced by a zero at $(1/r, \pi - \theta)$ where $0 < r < 1$. This generates a pair which is converted to a quartet by reflection in the real axis. FIG. 2 illustrate this, the quartet being 21, 22, 23 and 24. There is a degenerate case, referred to as type 2D, in which the two poles and the two zeros coalesce into a single pole 25 and a single zero 26 on the real axis. Using the notation above the pole is at $(r,0)$ and the zero at $(1/r, \pi)$.

Figure 3:
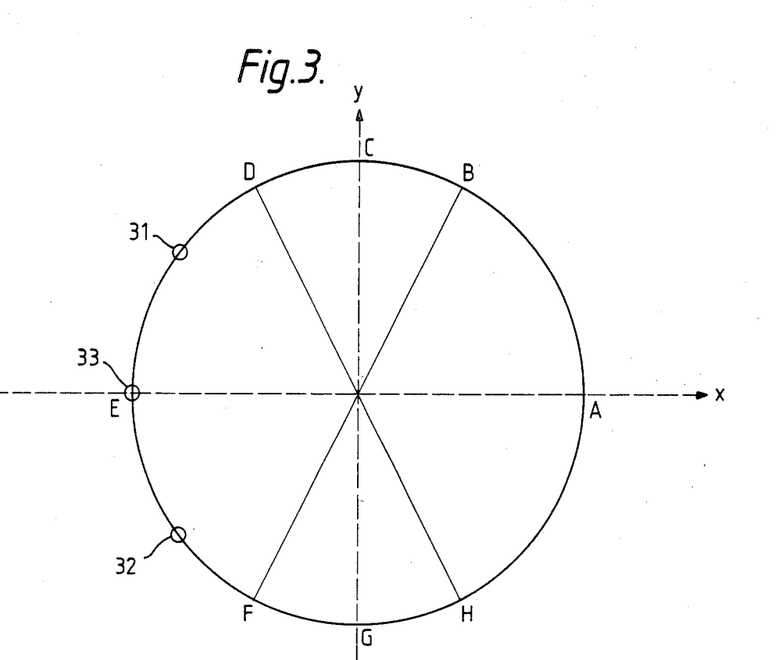

TYPE 3 symmetry applies to zeros in the stopband region. Referring to FIG. 3 there is a zero 31 on the arc ED balanced by a zero 32 which is its mirror image in the real axis, i.e. on the arc EF. The degenerate case consists of a single zero 33 at E, i.e. polar coordinates $(1, \pi)$. A zero at E is a preferred element of the low pass element.

It is preferred that all the singularities in the passband zones should be poles and all the singularities in the stopband zones should be zeros. It is important that the filtering should include elements which enhances frequencies in the transition band. To achieve this, it is preferred that all the singularities in the transition zone are poles although zeros may be permitted in the transition zone but only on the stop side of the centre.

Three preferred filter pairs according to the invention will now be described by way of example. They are identified as "Filter 1", "Filter 2" and "Filter 3". The filters are defined by their singularities and these are specified in Table 1 (for Filters 1 and 2) and in Table 2 (for Filter 3).

TABLE 1

| | | FILTER 1 | | | FILTER 2 | | |
| | | | $\theta$ | | | $\theta$ | |
| ID | TYPE | r | LOW | HIGH | r | LOW | HIGH |
|---|---|---|---|---|---|---|---|
| 1A | P | 0.9 | 90 | 90 | 0.93 | 90 | 90 |
| 1B | P | 0.9 | −90 | −90 | 0.93 | −90 | −90 |

TABLE 1-continued

| | | FILTER 1 | | | FILTER 2 | | |
|---|---|---|---|---|---|---|---|
| | | | $\theta$ | | | $\theta$ | |
| ID | TYPE | r | LOW | HIGH | r | LOW | HIGH |
| 2A | P | 0.5 | 89 | 91 | 0.65 | 86 | 94 |
| 2B | P | 0.5 | 91 | 89 | 0.65 | 94 | 86 |
| 2C | P | 0.5 | −91 | −89 | 0.65 | −94 | −86 |
| 2D | P | 0.5 | −89 | −91 | 0.65 | −86 | −94 |
| 3A | P | 0.2 | 0 | 180 | 0.2 | 0 | 180 |
| 3B | Z | 5.0 | 180 | 0 | 5.0 | 180 | 0 |
| 4A | Z | 1 | 112 | 68 | 1 | 102 | 78 |
| 4B | Z | 1 | −112 | −68 | 1 | −102 | −78 |
| 5A | Z | 1 | 157 | 23 | 1 | 110 | 70 |
| 5B | Z | 1 | −157 | −23 | 1 | −110 | −70 |
| 6A | Z | 1 | 163 | 7 | 1 | 145 | 35 |
| 6B | Z | 1 | −163 | −7 | 1 | −145 | −35 |
| 7 | Z | 1 | 180 | 0 | 1 | 180 | 0 |

TABLE 2

| | | FILTER 3 | | |
|---|---|---|---|---|
| | | | $\theta$ | |
| ID | TYPE | r | LOW | HIGH |
| 1A | P | 0.95 | 90 | 90 |
| 1B | P | 0.95 | −90 | −90 |
| 2A | p | 0.85 | 85 | 95 |
| 2B | Z | 1.18 | 95 | 85 |
| 2C | Z | 1.18 | −95 | −85 |
| 2D | P | 0.85 | −85 | 95 |
| 3A | P | 0.62 | 74 | 106 |
| 3B | Z | 1.61 | 106 | 74 |
| 3C | Z | 1.61 | −106 | −74 |
| 3D | P | 0.62 | −74 | −106 |
| 4A | P | 0.20 | 0 | 180 |
| 4B | Z | 5.00 | 180 | 0 |
| 5A | Z | 1.00 | 106 | 74 |
| 5B | Z | 1.00 | −106 | −74 |
| 6 | Z | 1.00 | 180 | 0 |

The columns of Tables 1 and 2 have the following significances:
"ID" contains a reference code to identify the singularities;
"TYPE" contains either "P" for pole or "Z" for zero;
"r" is the radius vector of the singularities;
"$\theta$" is the relative angular frequency (in degrees) of the singularity.

It is emphasised that the values of "r" are the same for the low-pass and high-pass elements. The tables give both values of "$\theta$".

Figure 4:
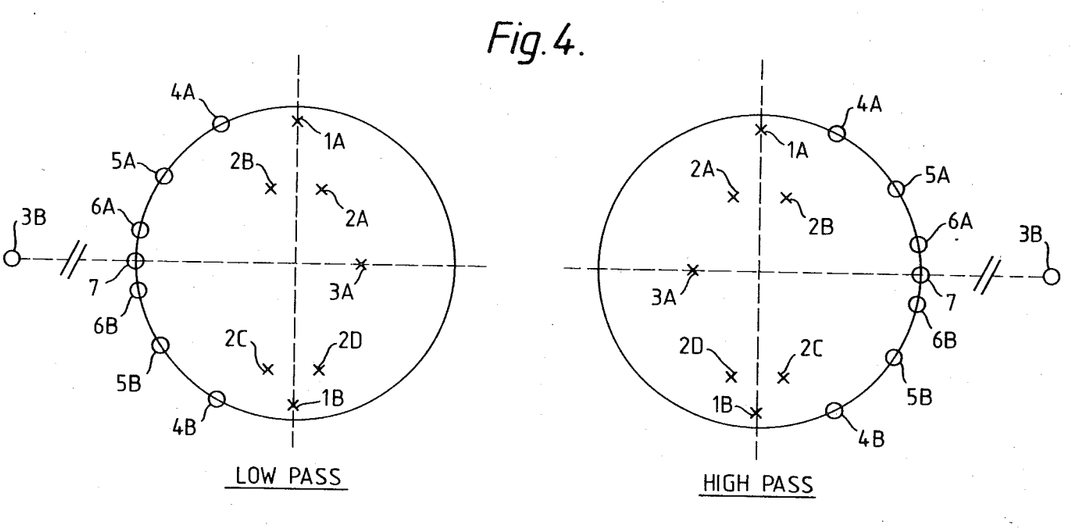
FIG. 4 shows the pattern of singularities in a preferred filter means

The pattern of singularities defined in Table 1 is illustrated in FIG. 4. (The pattern is not illustrated for Table 2).

The singularities of Table 1 are composed of symmetry groups.
TYPE 1D: one pair—namely 1A and 1B;
TYPE 1: one quartet—namely 2A, 2B, 2C and 2D;
TYPE 2D: one pair—namely 3A and 3B;
TYPE 3: three pairs—namely 4A and 4B; 5A and 5B; 6A and 6B;
SINGLE ELEMENT: namely 7.

It should also be noted that the singularities can be grouped as:
PASS BAND ZONE: one pole—namely 3A;
STOP BAND ZONE: eight zeros—namely 3B, 4A, 4B, 5A, 5B, 6A, 6B and 7;
TRANSITION BAND ZONE: six poles—namely 1A, 1B, 2A, 2B, 2C and 2D.

The singularities of Table 2 are composed of symmetry groups as follows:
TYPE 1D: one pair—namely 1A and 1B;
TYPE 2: two quartets—namely 2A, 3A, 2B, 3B, and 2C, 3C, 2D, 3D
TYPE 2D: one pair—namely 4A and 4B;
TYPE 3: one pair—namely 5A and 5B;
SINGLE ELEMENT: namely 6.

It should also be noted that the singularities can be grouped as:
PASSBAND ZONE: three poles—namely 3A, 3D and 4A;
STOPBAND ZONE: six zeros—namely 3B, 3C, 4B, 5A, 5B; and 6;
TRANSITION BAND ZONE: four poles—namely 1A, 1B, 2A and 2D; two zeros—namely 2B and 2C.

In a preferred implementation the filter means contains three sub-units, i.e. a common sub-unit to enhance frequencies in the transition band and separate sub-units to attenuate the frequencies in the two stop bands.

The implementation of these filters means will now be described with special reference to the realisation of filters similar to Filter 1. The stages used to implement this realisation will be described first.

Figure 5A:
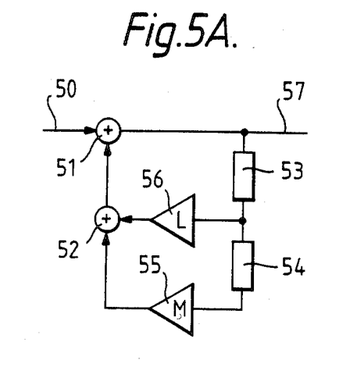
FIG. 5A and 5B illustrate conventional stages for implementing poles

FIG. 5A shows a conventional recursive stage for implementing a pair of poles. It comprises an input line 50 which enters an adder 51 the output of which is connected both to the output line 57 and a casscade of two delays 53 and 54. The output of delay 53 is connected via multiplier 56 (with coefficient L) to adder 52. The other input of adder 52 is obtained from delay 54 via multiplier 55 (with coefficient M). The output of adder 52 returns to form the second input of adder 51.

In use the stage stores two previous outputs on delays 53 and 54 and its output constitutes sum $$y(o) = x(o) + Ly(1) + My(2)$$

where x(o) is the present input, y(1) is the previous output, y(2) is the output before y(1) and y(o) is the present output.

One stage of this type is needed to implement poles 2A and 2D a second to implement 2B and 2C. The coefficients L and M are calculated by standard techniques from the coordinates (r, $\theta$) of the poles. In the case of poles 1A and 1B, coefficient L is zero and the stage can be simplified to that shown in FIG. 5B. Connecting the three stages in sequence implements the poles in the transition zone.

Figure 6A:
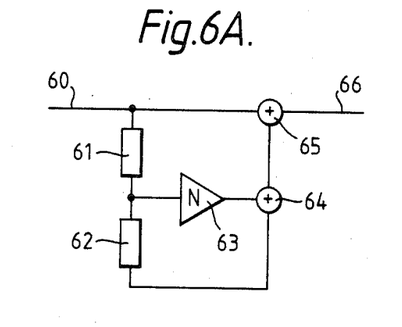
FIG. 6A, 6B and 6C illustrate conventional stages for implementing zeros

FIG. 6A shows a conventional stage for implementing a pair of zeros. It comprises an input line 60 which splits to an adder 65 and a cascade of two delays 61 and 62. The two delays are connected as inputs to adder 64, delay 61 is being connected via a multiplier 63 with coefficient L. The output of adder 65 is on the line 66 which carries the output of the stage.

In use, the stage stores two previous inputs in delays 61 and 62 and its output constitutes the sum:

$$y(o) = x(o) + Nx(1) = x(2)$$

where x(o) is the present input, x(1) is the previous input x(2) is the input before and y(o) is the present output.

Figure 6B:
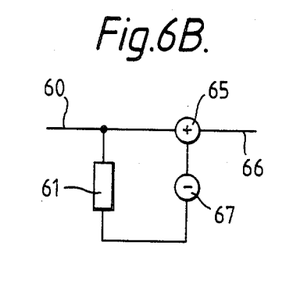
Figure 6C:
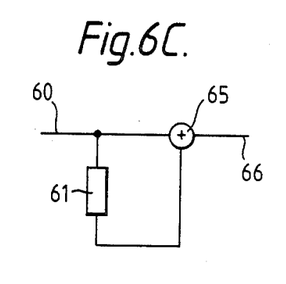

Three stages of this type are needed: i.e. one for each pair of zeros 4A/4B, 5A/5B and 6A/6B. Simplified versions are needed to implement zeros 7 (Table 1). FIG. 6B shows an implementation which contains an inverter 67 so that DC is removed and low frequency signals are attenuated. This is used in the highpass element. FIG. 6C illustrates the equivalent stage for removing signals with relative angular frequency 180°. This is used in the lowpass element.

Figure 7A:
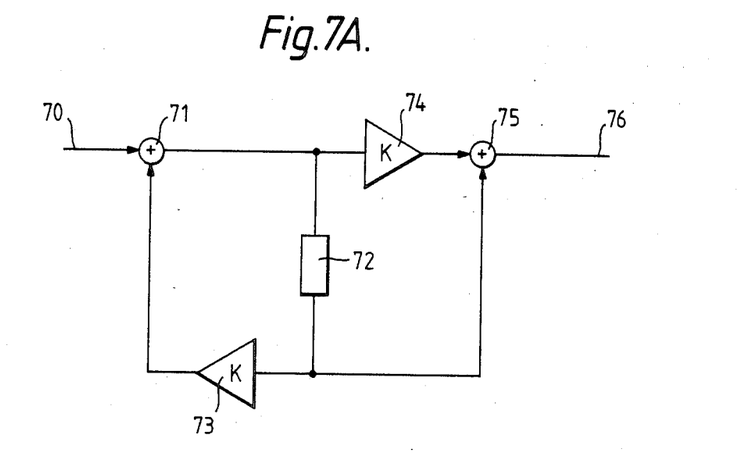
FIGS. 7A and 7B illustrate stages for implementing poles and zeros at relative frequencies 0° and 180°

FIG. 7A shows a stage for implementing the singularities 3A and 3B. It comprises input line 70 and output line 76. The output of adder 71 is connected as a loop back to its second input. The loop contains delay 72 and multiplier 73 (with coefficient K). This part of the stage implements pole 3A.

The output of adder 71 is also connected via multiplier 74 (with coefficient K) to an adder 75. The delay 72 is connected to the other output to adder 75. This part of the stage implements the zero 3B.

Figure 7B:
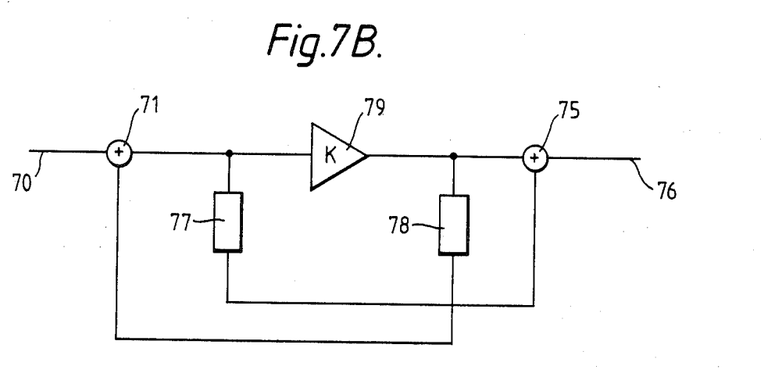

It is emphasised that, because the two singularities 3A/3B are symmetrically related, the two multipliers 73 and 74 have the same coefficient. This makes it possible to modify the stage shown in FIG. 7A to save a multiplier at the expense of an extra delay. FIG. 7B shows such a modification wherein the two multipliers 73 and 74 (both having a coefficient K) are replaced by a single multiplier 79 (with coefficient K) and the single delay 72 is replaced by two delays 77 and 78.

Figure 5B:
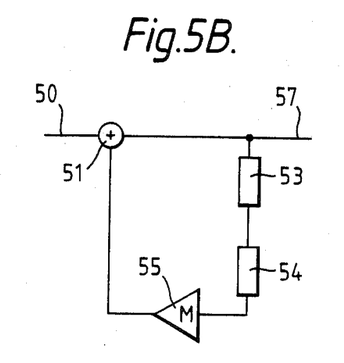

The stages shown in FIGS. 5-7 can be combined into a filter according to the invention. One arrangement is shown in FIG. 8, each stage is shown as a square which contains the figure number of the item represented.

In this embodiment stages 81, 82 and 83 constitute a common sub-unit which enhances signal components with frequencies in the transition region. Stages 84H, 85H, 86H, 87H and 88H constitute the element realising the higher frequency sub-band. Stages 84L, 85L, 86L, 87L and 88L constitute the element realising the lower frequency sub-band. The two elements are the same except that the N and K coefficients in the "high" element are the negative of the N and K coefficients in the "low" element. A stage of the type shown in FIG. 6B is included when N and K are negative, and one of the type shown in FIG. 6C when N and K are positive. As mentioned above, the coefficients can be calculated from the singularities specified in Table 1.

Figure 8:
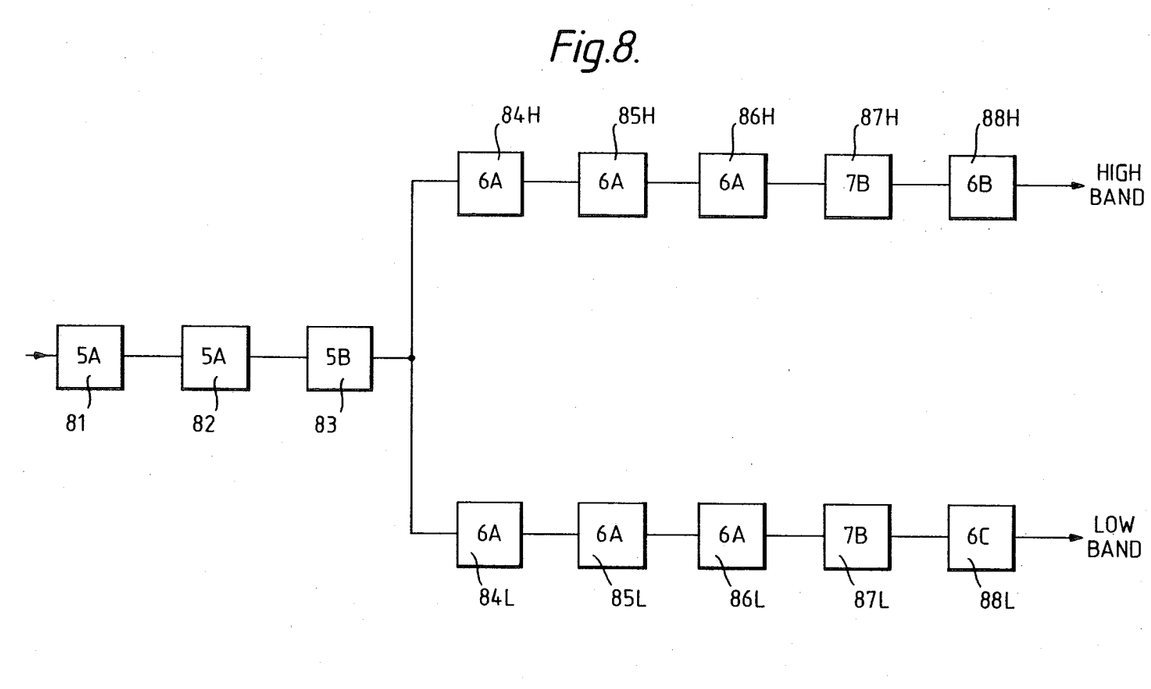
FIG. 8 illustrates a filter means according to the invention, using the stages shown in FIGS. 5 to 7

The implementation may be in the form of a circuit which corresponds functionally to FIG. 8 or it may be organised as a sequential device in which all the multiplications are carried out in the same multiplier operator. In either case, it is important to keep the number of multiplications as small as possible. The circuit shown in FIG. 8 is almost optimal. Combining stages 83, 84H and 84L to the configuration shown in FIG. 9 saves on multiplier (and gives the optimum since each multiplier has a different coefficient).

Figure 9:
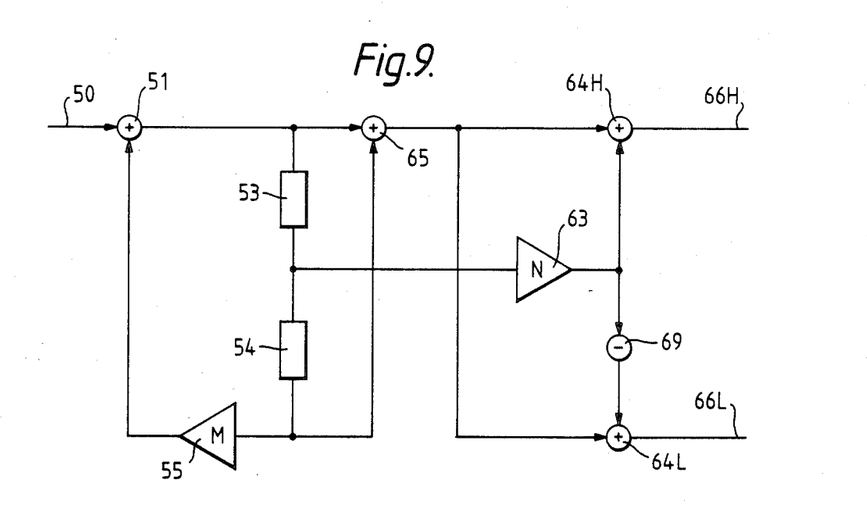
FIG. 9 shows a modification for the filter shown in FIG. 8

The combination shown in FIG. 9 has input line 50 connected to adder 51 the output of which returns to adder 51 via delays 53 and 54 and multiplier 55. This corresponds to stage 83 of FIG. 8. Delays 53 and 54 also serve as delays 61 and 62 of stages 84H and 84L. The output of adder 51 and delay 54 are also connected to adder 65 (which is also common to stages 84H and 84L). The output of delay 53 is connected to multiplier 63 (which is also common to stages 84H and 84L) which is connected direct to adder 64H and via inverter 69 to adder 64L. The output of adder 64H, on line 66H, is connected to stage 85H. The output of adder 64L, on line 66L is connected to stage 85L. This reduction in the number of elements saves costs and/or reduces the cycle time of the processing.

Figure 10:
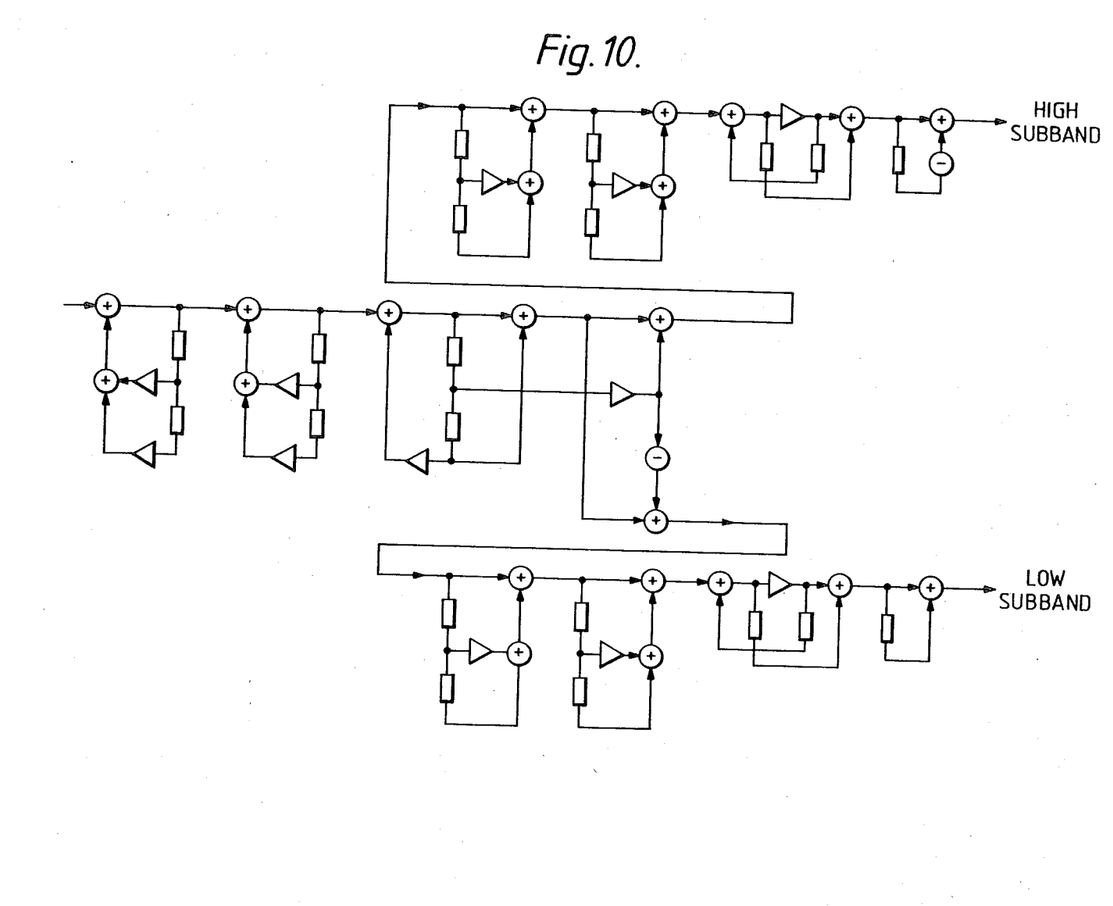
FIG. 10 is a more detailed version of FIG. 8 including the modification of FIG. 9.

A diagram of the full realisation is given in FIG. 10.

Figure 11:
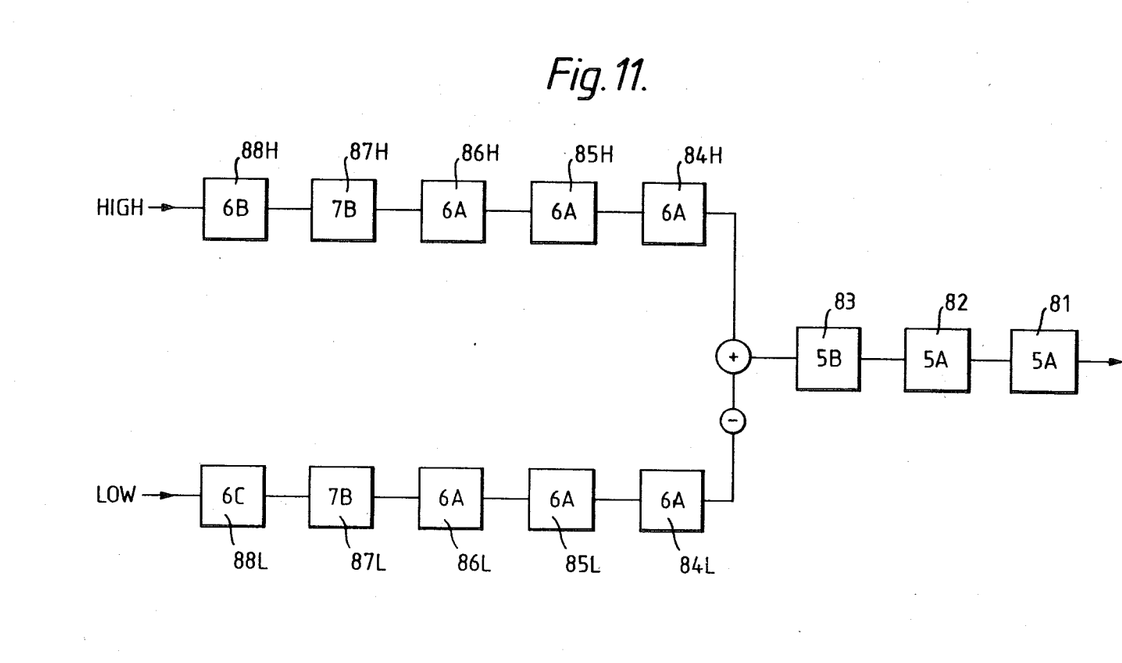
FIG. 11 is a reciprocal filter means for recombining subbands separated by the filter means of FIG. 8.

A network, for use at the receiving end, which recombines the subbands is shown in FIG. 11. This network is substantially the same as FIG. 10 in reverse order.

In a coding apparatus, the filters shown will be followed by down samplers and encoders, as is conventional; after transmission, the two coded channels are up-sampled and passed through interpolation filters prior to recombination. If, as here, the upper and lower band splitting filters have z-transform transfer functions $H_1$, $H_2$ with $H_1(z)=H_2(-z)$, then in order to satisfy the alias cancellation criteria (as discussed in the Esteban and Galand paper referred to above), upper and lower sub-band interpolation filters can be used with $K_1(z)=H_1(z)$ and $K_2(z)=-H_2(z)$.

Thus, the interpolation filters can be identical to the band splitting filters except for inversion in one channel. In this case, of course, a common filter section will follow the two individual filter sections.

I claim:

1. A digital filter including:
   an input terminal connected to receive an input signal;
   filter means connected to said input terminal, said input terminal applying said input signal to said filter means, said filter means having a stopband, a transition band and a passband, said filter means for filtering said input signal in accordance with an associated characteristic transfer function, said filter means including pole generating means for generating poles enhancing input signal frequencies in the passband, zero generating means for generating zeros attenuating input signal frequencies in the stopband, and pole generating means for generating poles enhancing input signal frequencies in the transition band, the singularities of said transfer function comprising a pole attenuating input signal frequencies in the stopband, said pole lying, in the z-plane representation, on the real axis at unit radius, and additional singularities occurring in groups each possessing a symmetrical delay response about a relative frequency of $\pi/2$ radians, said filter means transfer function characterized in that at least one of such groups consists of a pole having z-plane coordinates r, $\theta$ within a polar coordinate system and a zero having coordinates 1/r, $(\pi-\theta)$ within said polar coordinate system, and
   an output terminal connected to said filter means and to receive said filtered input signal.

2. A digital filter arrangement comprising:
   input terminal means for connection to an input signal;
   (a) a low-pass filter means, connected to said input terminal means, for filtering said input signal, said low-pass filter means having a stopband contained in an upper subband and a passband contained in a lower subband, the characteristics of said low-pass filter means being defined by an associated transfer function; and
   (b) a high-pass filter means, connected to said input terminal means, for filtering said input signal, said high-pass filter means having a stopband coincident with the passband of the low-pass filter means and a passband coincident with the stopband of the low-pass filter means, the characteristics of said high-pass filter means being defined by an associated transfer function,
   the transfer function of both filters being implemented by pole generating means for generating poles enhancing input signal frequency components in a transition band between the stopband and passband, and zero generating means for generating zeros attenuating input signal frequency components in the filter stopband and poles enhancing input signal frequency components in the filter passband, wherein the transfer function of one of said filter means has singularities lying in the z-plane representation at polar coordinates r, $\theta$ within a polar coordinate system and the transfer function of the other filter means has like singularities lying at polar coordinates r, $(\pi - \theta)$ within said polar coordinate system;

wherein the low-pass and high-pass filter means transfer functions have zeros at coordinates 1, $\pi$ and 1, $\theta$, respectively, within said polar coordinate system and the remainder of the singularities of said filter transfer functions occur in groups each possessing a symmetrical delay response about a relative frequency of $\pi/2$ radians, characterized in that at least one of such groups consists of a pole having, in the z-plane, polar coordinates r, $\theta$ and a zero having coordinates 1/r, $(\pi - \theta)$ within said polar coordinate system.

3. A digital filter arrangement according to claim 2, wherein all the singularities in that section of the z-plane bounded by angles corresponding to the frequency limits of the transition band are poles.

4. A digital filter arrangement according to either claim 2 or 3, wherein all the singularities in the portions of the z-plane relating to the passband regions are poles and all the singularities in the portions of the z-plane relating to the stopband regions are zeros.

5. A digital filter arrangement according to claim 2 or 4 which comprises three filters which are:
   (a) a common filter for enhancing signals with frequencies in the transition band,
   (b) a lower filter including zeros for attenuating signals with frequencies in the upper subband and at least one pole for enhancing signals with frequencies in the lower subband, and
   (c) an upper filter including zeros for attenuating signals with frequencies in the lower subband and at least one pole for enhancing signals with frequencies in the upper subband,
wherein the output of the common filter is connected as input to the lower and upper filters.

6. A digital filter arrangement according to claim 2 or 4, which comprises:
   (a) a common filter for enhancing signals with frequencies in the transition band,
   (b) a lower filter having a transfer function including zeros for attenuating signals with frequencies in the upper subband and at least one pole for enhancing signals with frequencies in the lower subband, and
   (c) an upper filter having a transfer function including zeros for attenuating signals with frequencies in the lower subband and at least one pole for enhancing signals with frequencies in the upper subband,
wherein the outputs of the upper and lower filter are combined to form the input to the common filter.

7. A subband coding transmission system comprising:
input terminal means for connection to an input signal;
a coder arrangement, said input terminal means applying said input signal to said arrangement, said arrangement comprising:

(a) a low-pass filter, connected to receive said input signal, having a stopband contained in an upper subband and a passband contained in a lower subband, the characteristics of said low-pass filter being defined by an associated transfer function; and (b) a high-pass filter, connected to receive said input signal, having a stopband coincident with the passband of the low-pass filter and a passband coincident with the stopband of the low-pass filter, the characteristics of said high-pass filter being defined by an associated transfer function, both filters including pole generating means for generating poles enhancing signals with frequencies in a transition band between the stopband and passband, each filter including zero generating means for generating zeros attenuating signals with frequencies in the filter stopband and poles enhancing signals with frequencies in the filter passband, wherein the transfer function of one filter has singularities lying the the z-plane representation at polar coordinates r, $\theta$ within a polar coordinate system and the transfer function of the other filter has like singularities lying at polar coordinates r, $(\pi - \theta)$ within said polar coordinate system;

wherein the low-pass and high-pass filter transfer functions have zeros at coordinates 1, $\pi$ and 1, $\theta$, respectively, within said polar coordinate system and the remainder of the singularities of said filter transfer functions occur in groups each possessing a symmetrical delay response about a relative frequency of $\pi/2$ radians, characterized in that at least one of such groups consists of a pole having, in the z-plane, polar coordinates r, $\theta$ and a zero having coordinates 1/r, $(\pi - \theta)$ within said polar coordinate system; and a decoder, connected to said arrangement, said decoder comprising at least one filter arrangement according to claim 2 or 4.

8. A digital filter for filtering an input signal having frequency components in upper and lower frequency subbands, said filter comprising:

low-pass filter means, connected to receive said input signal, for passing input signal frequencies within said lower subband and for blocking input signal frequencies within said upper subband in accordance with a predetermined characteristic transfer function associated therewith, said low-pass filter means having singularity generating means for generating singularities lying in the z-plane representation at polar coordinates r, $\theta$, including: (1) at least one pole causing enhancement of signal frequencies within said lower subband, (2) at least one zero, lying at z-plane polar coordinates 1, $\pi$, within a polar coordinate system causing attenuation of signal frequencies within said upper subband, and (3) at least one further pole causing enhancement of signal frequencies within a transition frequency subband situated between said upper and lower subbands; and high-pass filter means, connected to receive said input signal, for passing input signal frequencies within said upper subband and for blocking input signal frequencies within said lower subband in accordance with a predetermined characteristic transfer function associated therewith, said high-pass filter means transfer function having singularities lying at polar coordinates r, $(\pi-\theta)$ within said polar coordinate system, including: (1) at least one pole causing enhancement of signal frequencies within said upper subband (2) at least one zero, lying at z-plane polar coordinates 1, Q, within said polar coordinate system causing attenuation of signal frequencies within said lower subband, and (3) at least one further pole causing enhancement of signal frequencies within said transition frequency subband wherein said poles and any additional zeros of the transfer function of said digital filter occur in groups possessing a symmetrical delay response about a relative frequency of $\pi/2$ radians, and at least one such group comprises a pole having z-plane coordinates r, $\theta$ and a zero having z-plane coordinates 1/r $(\pi-\theta)$ within said polar coordinate system.

9. A digital filter for filtering an input signal having frequency components in first and second frequency subbands, said filter having an associated predetermined characteristic transfer function, said filter comprising:

means, connected to receive said input signal, for introducing poles into said transfer function causing enhancement of signal frequencies within said first subband;

means, connected to receive said input signal, for introducing poles into said transfer function causing enhancement of signal frequencies within a transition frequency subband situated between said first and second subbands; and means, connected to receive said input signal, for introducing zeros into said transfer function causing attenuation of signal frequencies within said second subband, wherein said filter transfer function has a pole which, in the z-plane representation, lies on the real axis at unit radius, the singularities of said filter transfer function occur in groups possessing a symmetrical delay response about a relative frequency of $\pi/2$ radians, and at least one of said groups comprises a pole having z-plane polar coordinates r, $\theta$, with a polar coordinate system and a zero having z-plane polar coordinates 1/r, $(\pi-\theta)$ within said polar coordinate system.

10. In a digital filter of the type separating a broadband input signal into first and second distinct frequency subbands, the characteristic transfer function of said filter having singularities occurring in groups possessing a symmetrical delay response about a relative frequency of $\pi/2$ radians, an improvement comprising means for introducing into said filter transfer function a pole having z-plane polar coordinates r, $\theta$ within a polar coordinate system and and means for introducing a zero having z-plane polar coordinates 1/r, $(\pi-\theta)$ within said polar coordinate system.

11. A filter as in claim 10 wherein said filter defines a stopband and a passband, the effect of said zero is to attenuate input signal frequencies lying within said stopband, and the effect of said pole is to enhance input signal frequencies lying within said passband.

12. A filter as in claim 11 wherein all of the singularities of said filter transfer function located in portions of the z-plane relating to said passband are poles, and all of the singularities of said filter transfer function located in portions of the z-plane relating to said stopband are zeros.

* * * * *